(12) United States Patent
Pruefer

(10) Patent No.: US 6,516,514 B1
(45) Date of Patent: Feb. 11, 2003

(54) METHOD FOR MOUNTING COMPONENTS ONTO A SUBSTRATE

(75) Inventor: Martin Pruefer, Munich (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/572,540

(22) Filed: May 17, 2000

(30) Foreign Application Priority Data

Jun. 1, 1999 (DE) .......................................... 199 25 217

(51) Int. Cl.⁷ .............................. H05K 3/30; B23P 19/00
(52) U.S. Cl. .............................. 29/832; 29/740; 29/833; 29/840
(58) Field of Search ........................ 29/832, 740, 741, 29/833, 840

(56) References Cited

U.S. PATENT DOCUMENTS

| | | | |
|---|---|---|---|
| 5,285,946 A | | 2/1994 | Tomigashi et al. |
| 5,537,204 A | | 7/1996 | Woodhouse |
| 5,740,604 A | * | 4/1998 | Kitamura et al. ............. 29/740 |
| 5,743,005 A | * | 4/1998 | Nakao et al. .................. 29/740 |
| 5,778,525 A | * | 7/1998 | Hata et al. ..................... 29/740 |
| 5,862,586 A | | 1/1999 | Kimura |
| 5,933,942 A | * | 8/1999 | Kitamura et al. ............. 29/740 |
| 5,979,045 A | * | 11/1999 | Nishimori et al. ............ 29/740 |
| 6,044,169 A | * | 3/2000 | Hirotani et al. ............... 29/740 |
| 6,058,599 A | * | 5/2000 | Hanamura .................... 29/740 |
| 6,199,272 B1 | * | 3/2001 | Seto et al. ..................... 29/740 |
| 6,223,428 B1 | * | 5/2001 | Nonaka et al. ................ 29/740 |
| 6,374,484 B1 | * | 4/2002 | Yoshida et al. ............... 29/740 |
| 6,408,505 B1 | * | 6/2002 | Hata et al. ................... 297/740 |

FOREIGN PATENT DOCUMENTS

| | | |
|---|---|---|
| DE | 295 13 799 U1 | 11/1995 |
| EP | 0 779 777 | 6/1997 |
| JP | 04279099 A | 10/1992 |
| WO | WO 92/22827 | 12/1992 |
| WO | WO 97/37522 | 10/1997 |
| WO | WO 98/37744 | 8/1998 |

* cited by examiner

Primary Examiner—Carl J. Arbes
(74) Attorney, Agent, or Firm—Harness, Dickey & Pierce PLC.

(57) ABSTRACT

A method for mounting or equipping components onto substrates that utilizes a number of component mounting process areas. Each of the process areas includes a component mounting head member or equipping head for mounting the components, a number of supply units for supplying the components to the component mounting head member and a transport member for moving the components between the process areas. The method utilizes a single or a multiple stage or a combined single and multiple stage component mounting process for mounting the components, whichever is determined to be optimally utilized. The single stage process is optimally utilized for a small number of components to be mounted. The single stage process includes completely mounting the components at one of the process areas as compared to the multiple stage process which includes mounting or equipping the components at a combination of successive process areas.

8 Claims, 2 Drawing Sheets

METHOD FOR MOUNTING COMPONENTS ONTO A SUBSTRATE

BACKGROUND OF THE INVENTION

1. Field of the Invention

The present invention relates to a method of mounting components onto a substrate, that is, a method of equipping a substrate with components. In particular, a method for mounting electrical components onto a substrate, such as, a circuit board.

2. Description of the Prior Art

During known component mounting or equipping methods, such as, mounting components onto a circuit board, the components are removed from a number of supply units via a component mounting head member. Once removed, the component mounting head member then places or mounts the component onto the substrate at a predetermined position. There exists a need in the art to have the components placed or mounted onto the substrate at an increased or optimal component mounting rate, that is, an increased number of mounted components per unit time.

The International Patent No. WO 98/37744 provides a device for manufacturing an electrical assembly. This device has two longitudinal guides that extend parallel and closely together along a central component mounting process area for receiving a respective carriage that can then move along the guides. Each of the carriages includes a mounting element that is adapted for accepting a respective component mounting head member. In this way, each of the component mounting head members can operate independently of one another wherein a component mounting process area exists for the operation of each of the component mounting head members. With two, independently-operating component mounting process areas, the component mounting rate can, thus, be increased.

In order to realize an increased component mounting rate, a number of automatic component mounting units that each have a component mounting head member for receiving and mounting the components and that are positioned in an assembly-line manner have been utilized. Each of the automatic component mounting units also includes a component supply member wherein each of the automatic component mounting units can be dedicated to mount particular type of component. In this way, a respective component mounting process area is designated for each of the component mounting units wherein the mounting process for a particular substrate is divided amongst each of the component mounting units, that is, each of the component mounting units operates to mount a different component onto the substrate.

In order to decrease down time and thereby increase the component mounting rate, such as, from the time it takes to move the substrate from one process area to the next, two transport members are utilized. However, a high percentage of down times still exists in substrates that have a low mounting or placement content (less than about 100 components) due to the need to newly measure or calibrate the reference marks on the substrate after transport into the next processing area along the assembly line. Still further, a lower component mounting efficiency or rate results from an under utilization of the holding element of the component mounting head member. Typically, the holding element includes a number of holding elements, such as, twelve to eighteen suction pipettes. An under utilization occurs when only a portion of the holding elements are utilized for receiving and mounting a component where the amount of time to mount the components is essentially the same whether all or only a portion of the holding elements are utilized.

SUMMARY OF THE INVENTION

It is an object of the present invention to provide a method for mounting or equipping a number of components onto a substrate that results in an increased component mounting rate or efficiency. It is still further an object of the present invention to provide a method for mounting a small number of components, such as, one hundred or fewer components, onto a substrate while realizing increased and optimal component mounting or equipping rates.

The present invention provides a method for mounting a number of components that employs a number of component mounting process areas that are successively positioned in an assembly-line manner. Each of the component mounting process areas includes a component mounting head member for mounting a number of components onto the substrates and a number of supply units, each containing only components of one component type, for supplying the component mounting head members with the components. The present invention further employs a transport member for moving each of the substrates to each of the component mounting process areas.

In an embodiment, the present invention includes at least a first and second component mounting process area or processing areas.

In an embodiment, the component transport member includes a first and second transport member for moving a respective number of components.

In an embodiment, the substrates are completely mounted or equipped with a number of components having a number different component types during a single stage component mounting process when the number of different component types to be mounted is less than or equal to a number of supply units, that is, the number of different component types is small in number. By utilizing a single stage mounting process, the component mounting rate is optimally increased by eliminating the need to newly calibrate or measure the component mounting head member or equipping head relative to the substrate in each of the successive component process areas and by optimal utilization of the component mounting head member. When the number of different component types to be mounted is greater than the number of supply units, that is, when the number of different component types is large in number, a multiple stage component mounting process is utilized wherein the number of different component types are completely mounted onto the substrate in at least the first and second component process areas.

In an embodiment, the substrates are completely mounted with a number of different component types during a single stage component mounting process at one of the first or second component mounting process areas when the number of different component types to be mounted is less than or equal to a number of supply units, that is, the number of different component types is small in number and when the time difference between mounting or equipping components in the first and second process areas is positive. If the time difference is negative or the number of different component types to be mounted is greater than the number of supply units, then a multiple stage mounting process is utilized.

In an embodiment, the transport member includes a first and second transport member each for transporting a respective portion of the substrates between at least the first and second component mounting process areas.

In an embodiment, at least the first and second component mounting process areas includes a first and second group of supply units that are disposed adjacent to the first and second transport members, respectively, so as to further increase the efficiency or rate of mounting components onto the respective substrates.

DESCRIPTION OF THE PREFERRED EMBODIMENTS

Figure 1:
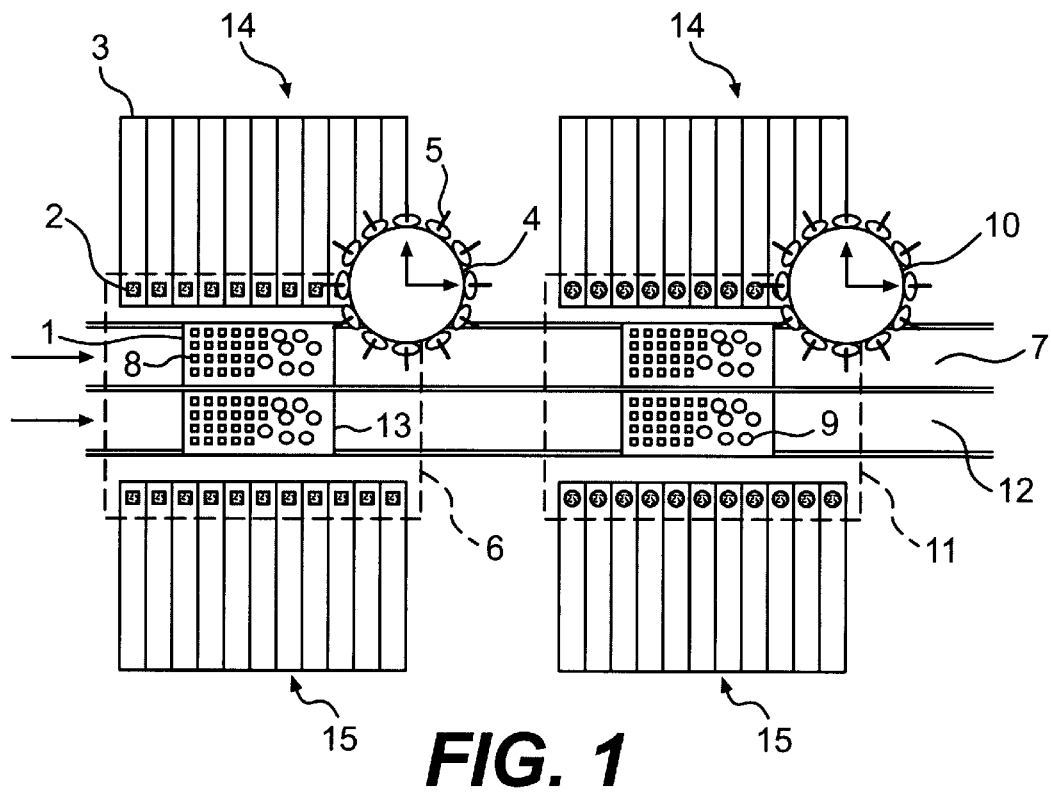
FIG. 1 is a schematic top view a method for mounting a number of components onto a number of substrates that employs a multiple stage component mounting process.

FIG. 1 illustrates a schematic top view of a multiple stage component mounting process for mounting a number of components onto a number of substrates that utilizes a number of component process areas wherein the substrates are mounted with a respective number of components. The present invention preferably includes at least a first component mounting process area 6 and a second component mounting process area 11. In the first component process area 6, a first substrate 1 is mounted or equipped with a number of components 2 that are supplied or delivered from a number of supply units 3, each containing only components of one component type, to a component mounting head member 4 for mounting the components onto the first substrate 1. The first component mounting head member or first equipping head 4 has a number of holding elements 5 wherein each of said holding elements 5 securely holds a respective component 2 for mounting. The holding elements 5 preferably include suction pipettes but can include other like holding elements 5.

Once the component mounting head member 4 receives the components 2 from the supply units 3, the first component mounting head member 4 moves or transports the components 2 to a predetermined position that is located above the substrate for subsequently mounting the components 2 at the predetermined position. The components 2 include a number of different component types, such as, a first 8 and second 8 component type. The component mounting head member 4 essentially moves in a direction that is parallel to a surface of the substrate. Therefore, the component mounting head member 4 is movable within the first component process area 4.

Once the first component type 8 has been mounted onto the first substrate, the first substrate 1 is moved to the second component process area 11 via a first transport member 7 wherein the first 6 and second 11 component process areas are positioned in an assembly-line manner. In the second component process area 1, a second component mounting head member or second equipping head 10 operates to mount or equip the first substrate 1 with a group of components from the second component 9 type in a similar manner as the first component mounting head member 4 of the first component process area 6.

In addition to the first substrate 1, a second substrate 13 can be moved into the first 6 and second 11 component process areas via a second transport member 12. In this way, the second substrate 13 can be mounted with a number of components 2 from the first 6 and second 11 component mounting areas in a similar manner as the first substrate 1. In order to mount a variety of different components, additional component process areas may be utilized that are each successively positioned along the first 7 and second 12 transport members in an assembly-line fashion. The variety of different components preferably includes electrical components for circuit boards, such as, resistors, integrated circuits or other like electrical components.

Figure 2:
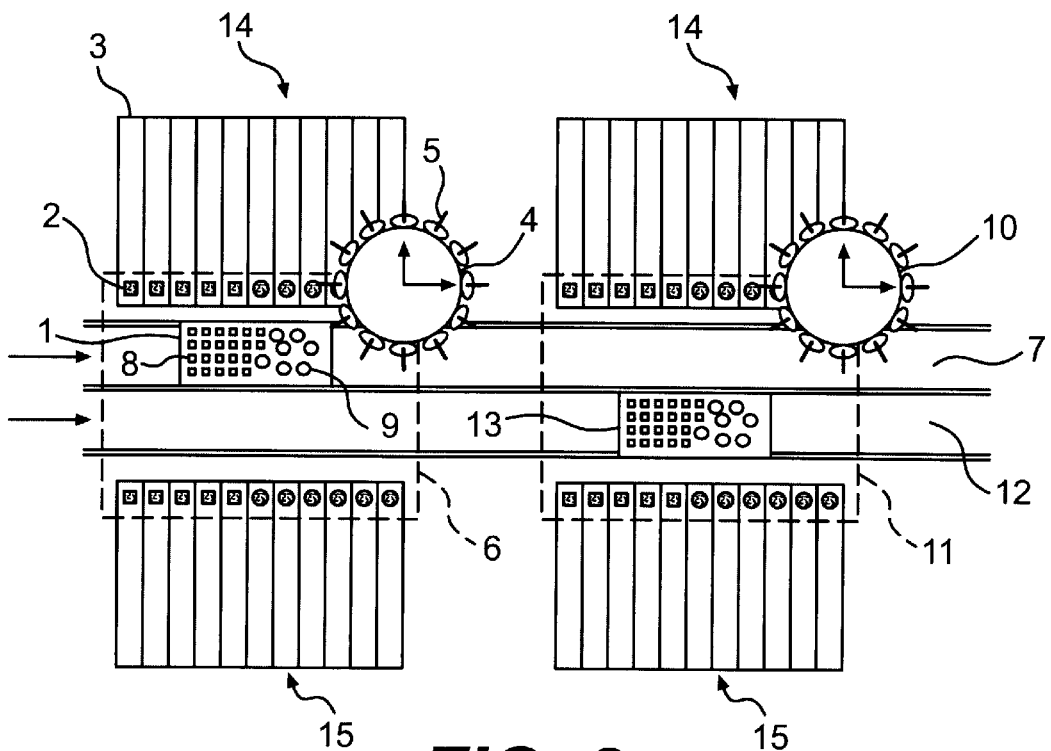
FIG. 2 is a schematic top view a method for mounting a number of components onto a number of substrates that employs a single stage component mounting process.

In FIG. 2, the first 6 and second 11 component process areas or processing are utilized for mounting a small number of components as compared to a typical multiple stage mounting process as illustrated in FIG. 1. A small number of components typically includes one hundred or fewer components to be mounted per substrate. With a small number of components for mounting, the multiple stage component mounting process of FIG. 1 would not be optimally utilized, that is, the component mounting rate of the multiple component mounting process would decrease if it were utilized for a small number of components. This decreased component mounting rate results from a variety of different factors, such as, the under utilization of the holding elements 5, the equal time that it takes to measure or calibrate the component mounting head member relative to the substrate location for each of the component mounting process areas regardless of the number of components that are to be mounted, or other like factors.

In order to effectively utilize an assembly-line type mounting process for mounting a small number of components, the substrate is completely mounted with its respective number of components 2 at a single process area, such as the first 6 or second 11 component process areas, rather than at two or a successive number of process areas as demonstrated in FIG. 1. In this way, a single stage component mounting process is utilized so that the component mounting head member is maximally utilized wherein the number of holding elements 5 that are not used is minimized. FIG. 2 illustrates that the first substrate 1 is moved to the first component process region or area 6 wherein it is mounted with components from the first 8 and second 9 component types thereby eliminating the need for further mounting processing at the second 12 or each of the successive component process areas. While the first substrate 1 is being mounted with first 8 and second 9 component types in the first component process area 6, the second substrate 13 can be moved into the second component process area 12 via the second transport member 12 for mounting of the components from the first 8 and second 9 component types in a similar way as the first substrate 1 is mounted. In this way, the first 1 and second 13 substrates that each require a small number of components can be optimally mounted by minimizing the down time that would be required if the typical large number or multiple stage component mounting process as illustrated in FIG. 1 was utilized. It is also possible to provide substrates in addition to the first 1 and second 13 substrate along either of the first 7 or second 12 transport members in order to effectively decrease the amount of time it takes to replace either of the first 1 or second 13 substrates with another substrate for mounting. In this way, the down time between mounting different substrates is minimized.

Figure 3:
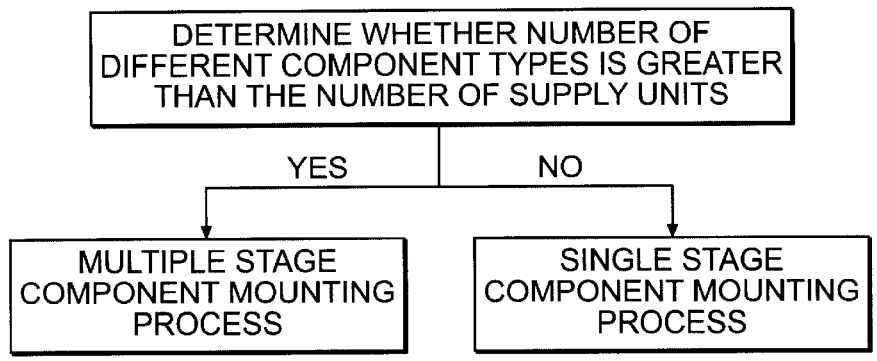
FIG. 3 is a flow diagram that illustrates the method step of determining a number of different components to a number of supply units so as to determine whether a single or multiple stage component mounting process is to be optimally utilized.

In FIG. 3, the preferred method step of determining whether the number of different component types to be mounted is greater than the number of supply units is illustrated. Based on this determination, the component mounting process can operate in a two or multiple stage component mounting operation process as illustrated in FIG. 1 or a one or single stage component mounting operation or process as illustrated in FIG. 2. After comparing the number of different component types to the number of supply units, the substrates are successively mounted or equipped in only one of the processing areas, such as the first or second component mounting processing areas, if the number of different component types is less than or equal to the number of supply units. In this way, a single stage mounting process of FIG. 1 is optimally utilized. However, if the number of different component types is greater than the number of supply units, the substrates are successively equipped in at least said first and second processing area. In this way, a multiple stage mounting process of FIG. 1 is optimally utilized.

Figure 4:
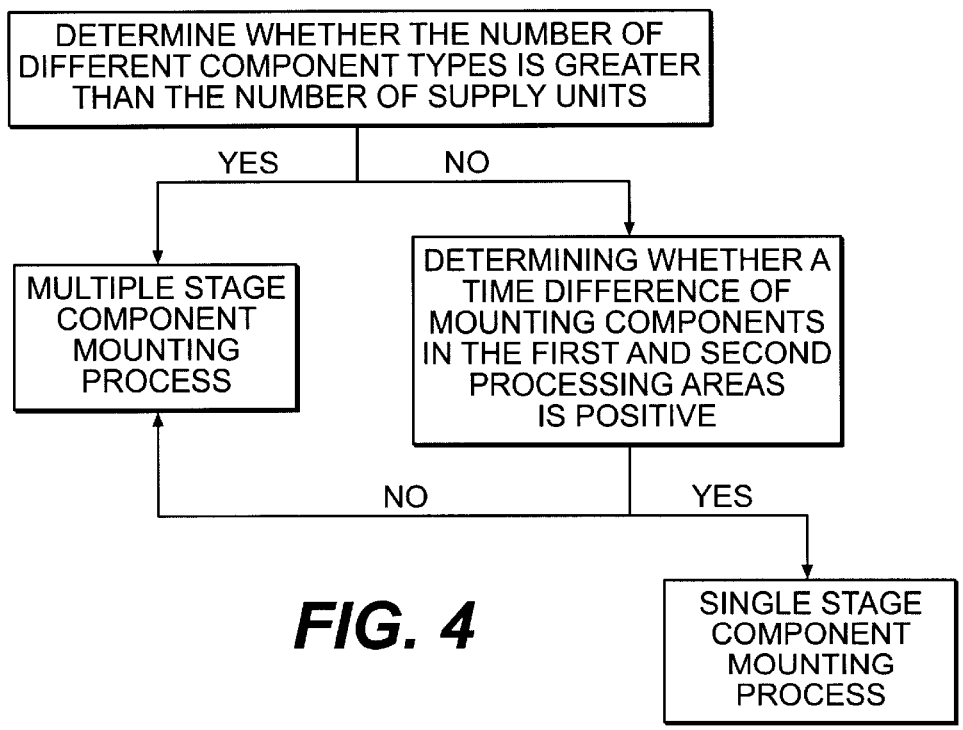
FIG. 4 is a flow diagram that illustrates the method step of determining the time difference between the equipping or mounting of components at the first and second process areas so as to determine whether a single or multiple stage component mounting process is to be optimally utilized.

In another embodiment as illustrated in FIG. 4, each of the equipping heads or component mounting head members includes a time characteristic associated therewith. The number of different component types and the number of supply units are determined and compared. If the number of different component types is less than or equal to the number of supply units, a determination and comparison is made of a time required to equip or mount the substrate with the number of components that utilizes the component mounting head member or equipping head of the first processing area with a time required to equip or mount the substrate with the number of components that utilizes the component mounting head member or equipping head of the second processing area, dependent on the respective time characteristics of the component mounting head members or equipping heads, to obtain a time difference. If the time difference is positive, equipping or mounting the substrate is conducted in only one of the processing areas or mounting process areas. In this way, the single stage mounting process is optimally utilized. If the time difference is negative, equipping or mounting the substrate in at least the first and second mounting processing areas wherein the multiple stage mounting process is optimally utilized. If the number of different component types to be placed or mounted onto the substrate is greater than the number of supply units, the substrate is successively equipped or mounted in at least the first and second processing areas wherein the multiple stage mounting process is optimally utilized.

The present invention also includes a combined single and multiple stage mounting process. The substrates that require a larger total number of components, that is, the total number of components are greater than the total number of supply units, can be processed along one of the first or second transport members in the multiple stage mounting process of FIG. 1. In addition, the substrates that require a smaller total number of components can be processed along one of the first or second transport members that is not utilized for the larger number component mounting process. In this way, the single stage mounting process can be utilized so as to facilitate the optimal use of the mounting process equipment in order to optimally increase the rate at which the substrates are mounted with components.

In order to additionally increase the efficiency or rate at which the components are mounted onto the substrates, each of the supply units includes a first and second supply group. The first supply group is adjacent to the first transport member wherein the second supply group is adjacent to the second transport member. The supply units of the first supply group contain components to be mounted onto the substrates that are transported along the first transport member. Likewise, the supply units of the second supply group include components to be mounted onto the substrates that are transported along the second transport member. In this way, the distance over which the component mounting head must travel to mount the components onto the substrates is minimized because the supply units are essentially adjacent to the substrate onto which the components are to be mounted.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for equipping a substrate with a plurality of components of respectively different component types, comprising the steps of:

providing at least a first processing area and a second processing area through which a substrate is successively moveable;

at each of said first and second processing areas, disposing an equipping head in connection with a number of supply units, each of said supply units containing only components of one component type;

determining a number of said different component types to be placed on said substrate and comparing said number of different component types to be placed on said substrate with said number of supply units;

if said number of different component types to be placed on said substrate is less than or equal to said number of supply units, equipping said substrate in only one of said processing areas; and if said number of different component types to be placed on said substrate is greater than said number of supply units, successively equipping said substrate in at least said first and second processing areas.

2. The method according to claim 1 further comprising a plurality of substrates that are each successively moveable via a transport member into at least one of said first and second processing areas, said substrates including a first and second substrate portion, said transport member includes a first and second transport member for respectively moving said first and second substrate portions into at least said first and second processing areas, if said number of different component types to be placed on each of said substrates is less than or equal to said number of supply units, respectively equipping said first and second substrate portions in said first and second processing areas.

3. The method according to claim 2 wherein each of said supply units includes a first and second supply group respectively disposed adjacent to said first and second transport members, determining said number of different component types to be placed on one of said substrates that is located on said first transport member and comparing said number of different component types with a number of supply units within said first supply group, and if said number of different component types is less than or equal to said number of supply units within said first supply group, equipping the substrate with the components from the first supply group in only one of the processing areas.

4. The method according to claim 2 wherein each of said supply units includes a first and second supply group respectively disposed adjacent to said first and second transport members, determining said number of different component types to be placed on one of said substrates that is located on said second transport member and comparing said number of different component types with a number of supply units within said second supply group, and if said number of different component types is less than or equal to said number of supply units within said second supply group, equipping the substrate with the components from the second supply group in only one of the processing areas.

5. A method for equipping a substrate with a plurality of components of respectively different component types, comprising the steps of:

provinding at least a first processing area and a second processing area through which a substrate is successively moveable;

at each of said first and second processing areas, disposing an equipping head in connection with a number of supply units, each of said supply units containing only components of one component type, each equipping head having a time characteristic associated therewith;

determining a number of said different component types to be placed on said substrate and comparing said number of different component types to be placed on said substrate with said number of supply units;

if said number of different component types to be placed on said substrate is less than or equal to said number of supply units, determining and comparing a time required to equip said substrate with said plurality of components using said equipping head in said first processing area with a time required to equip said substrate with said plurality of components using said equipping head in said second processing area, dependent on the respective time characteristics of said equipping heads, to obtain a time difference, and if said time difference is positive, equipping said substrate in only one of said processing areas and if said time difference is negative, successively equipping said substrate in at least said first and second processing areas; and if said number of different component types to be placed on said substrate is greater than said number of supply units, successively equipping said substrate in at least said first and second processing areas.

6. The method according to claim 5 further comprising a plurality of substrates that are each successively moveable via a transport member into at least one of said first and second processing areas, said substrates including a first and second substrate portion, said transport member includes a first and second transport member for respectively moving said first and second substrate portions into at least said first and second processing areas, if said number of different component types to be placed on each of said substrates is less than or equal to said number of supply units, respectively equipping said first and second substrate portions in said first and second processing areas.

7. The method according to claim 6 wherein each of said supply units includes a first and second supply group respectively disposed adjacent to said first and second transport members, determining said number of different component types to be placed on one of said substrates that is located on said first transport member and comparing said number of different component types with a number of supply units within said first supply group, and if said number of different component types is less than or equal to said number of supply units within said first supply group, equipping the substrate with the components from the first supply group in only one of the processing areas.

8. The method according to claim 6 wherein each of said supply units includes a first and second supply group respectively disposed adjacent to said first and second transport members, determining said number of different component types to be placed on one of said substrates that is located on said second transport member and comparing said number of different component types with a number of supply units within said second supply group, and if said number of different component types is less than or equal to said number of supply units within said second supply group, equipping the substrate with the components from the second supply group in only one of the processing areas.

* * * * *